US00RE38370E

(19) United States
(12) Reissued Patent
Vasché

(10) Patent Number: US RE38,370 E
(45) Date of Reissued Patent: Dec. 30, 2003

(54) DEPOSITED TUNNELING OXIDE

(75) Inventor: Gregory Vasché, Scottsdale, AZ (US)

(73) Assignee: Xicor, Inc., Milpitas, CA (US)

(21) Appl. No.: 10/053,140

(22) Filed: Nov. 2, 2001

Related U.S. Patent Documents

Reissue of:
(64) Patent No.: 5,977,585
Issued: Nov. 2, 1999
Appl. No.: 08/064,203
Filed: May 21, 1993

U.S. Applications:
(62) Division of application No. 07/545,122, filed on Jun. 26, 1990, now Pat. No. 5,219,774, which is a continuation of application No. 07/195,766, filed on May 17, 1988, now abandoned.

(51) Int. Cl.[7] ..... H01L 29/788
(52) U.S. Cl. ..... 257/321; 257/320; 257/317
(58) Field of Search ..... 257/321, 317, 257/320

(56) References Cited

U.S. PATENT DOCUMENTS 4,526,631 A * 7/1985 Silvestri et al. ..... 438/429
4,599,706 A * 7/1986 Guterman ..... 365/185.08
4,720,323 A * 1/1988 Sato ..... 438/261
4,763,177 A * 8/1988 Paterson ..... 257/315
4,763,299 A * 8/1988 Hazani ..... 365/185.14
4,851,370 A * 7/1989 Doklan et al. ..... 438/762
4,924,437 A * 5/1990 Paterson et al. ..... 365/185

OTHER PUBLICATIONS

Korma, E.J. et al. "$SiO_2$ Layers on Polycrystalline Silicon," in *Insulating Films on Semiconductors.* J.F. Verweij and D.R. Wolters, eds., Elsevier Science Publishing Co., Inc, N.Y., N.Y. pp. 278–281.*
Peek, H.L., "The Characterization and Technology of Deposited Oxides for EEROM", in *Insulating Films on Semiconductors,* J.F. and D.R. Wolters, eds., Elsevier Science Publishers B.V., 1983, pp. 261–265.*

* cited by examiner

*Primary Examiner*—Phat X. Cao
(74) *Attorney, Agent, or Firm*—Coudert Brothers LLP

(57) ABSTRACT

An apparatus and method for depositing a tunneling oxide layer between two conducting layers utilizing a low pressure, low temperature chemical vapor deposition (LPCVD) process is disclosed wherein tetraethylorthosilicate (TEOS) is preferably used. As applied to an electrically erasable programmable read only memory (EEPROM) device having polysilicon layers, the apparatus is constructed by forming a first layer of polysilicon, patterned as desired. A layer of silicon dioxide is then deposited by decomposition of TEOS to form the tunneling oxide to a predetermined thickness. If enhanced emission structures are desired, a layer of relatively thin tunneling oxide may be grown on the first layer of polysilicon. The oxide layer is then annealed and densified, preferably using steam and an inert gas at a specific temperature. A second layer of polysilicon is then formed on top of the tunneling oxide.

13 Claims, 3 Drawing Sheets

DEPOSITED TUNNELING OXIDE

Matter enclosed in heavy brackets [ ] appears in the original patent but forms no part of this reissue specification; matter printed in italics indicates the additions made by reissue.

This is a division of application Ser. No. 07/545,122 now U.S. Pat. No. 5,219,774, which issued Jun. 15, 1993 filed Jun. 26, 1990, which is a continuation of Ser. No. 07/195,766 filed May 17, 1988, now abandoned.

FIELD OF THE INVENTION

This invention relates to the field of integrated circuit processing and more specifically to a method of depositing tunneling oxide in an electrically erasable read-only memory device.

BACKGROUND OF THE INVENTION

EEPROM devices are nonvolatile memory devices in which the presence or absence of charge on a floating gate electrode indicates a binary one or zero. One EEPROM device is described in U.S. Pat. No. 4,579,706, entitled "Nonvolatile Electrically Alterable Memory". This patent is herein incorporated by reference. In this type of EEPROM device, the floating gate electrode is electrically insulated from the other electrodes of the device by one or more layers of tunneling oxide. Electrical charge is transferred to the floating gate by placing a voltage on a programming electrode which is sufficient to cause electrons to tunnel through the tunneling oxide to the floating gate electrode. In EEPROM devices, the tunneling oxide can conduct only a limited amount of charge under the high fields imposed across the oxide during tunneling before the tunneling oxide fails or breaks down, thus limiting the number of programming cycles. In some tunneling elements in an EEPROM array, this failure may occur in less than approximately 10,000 programming cycles, depending on the uniformity and intrinsic defect density of the tunneling oxide layer or layers.

The characteristics of the tunneling oxide layer are critical to the life and operation of an EEPROM device. In prior EEPROM devices, tunneling oxides are produced by growing an oxide using a thermal oxidation process. However, with this type of process, the oxide defect density is quite high, which causes a large number of early breakdown failures. As presently understood, this is because any defects in the underlying silicon may propagate into the silicon dioxide layer as it is grown. Furthermore, during the thermal oxidation process, the tunneling oxide develops a high level of stress. As presently understood, this phenomena causes defects resulting in early or premature failures in the oxide during tunneling, thus further limiting the life of the device. No technique is known for thermally growing a low-stress tunneling oxide, while providing an oxide layer with substantially zero defects.

SUMMARY OF THE INVENTION

Briefly described, the present invention contemplates a method and means of depositing a tunneling oxide layer between two conductors with a low pressure, low temperature chemical vapor deposition (LPCVD) process. Preferably, tetraethylorthosilicate (TEOS) is used for this deposition process. Where the present method is used in an EEPROM device and polysilicon layers are used for forming the device, the deposited oxide is formed as follows. According to the present invention, a first layer of polysilicon is deposited and patterned as desired. A layer of silicon dioxide is then deposited by a decomposition of tetraethylorthosilicate to form a predetermined thickness of tunneling oxide on the surface of the polysilicon. The oxide layer formed from the deposited tetraethylorthosilicate is then thermally annealed and densified. Preferably, this is performed using a mixture of steam and an inert gas, such as argon, at a predetermined temperature. The process may be repeated where more than one tunneling layer is desired. Where necessary, prior to depositing the tetraethylorthosilicate, where enhanced emission structures are desired on the surface of the polysilicon, a layer of relatively thin oxide thermal oxide may be grown on the surface of the polysilicon.

Accordingly, it is an object of the present invention to provide a tunneling oxide in an EEPROM device which may be deposited with a low pressure chemical vapor deposition process.

It is another object of the present invention to improve the useful lifetime of an EEPROM device.

It is yet another object of the present invention to improve the yield in EEPROM processing.

It is another object of the present invention to improve the reliability of an EEPROM device.

It is yet another object of the present invention to produce a tunneling dielectric that is not limited by the underlying defect density of the material on which the oxide layer is being formed.

It is yet another object of the present invention to produce a tunneling dielectric having minimum stress.

BRIEF DESCRIPTION OF THE DRAWINGS

These and other objects will be apparent through the description below and the accompanying drawings in which.

DETAILED DESCRIPTION OF THE INVENTION

Figure 1:
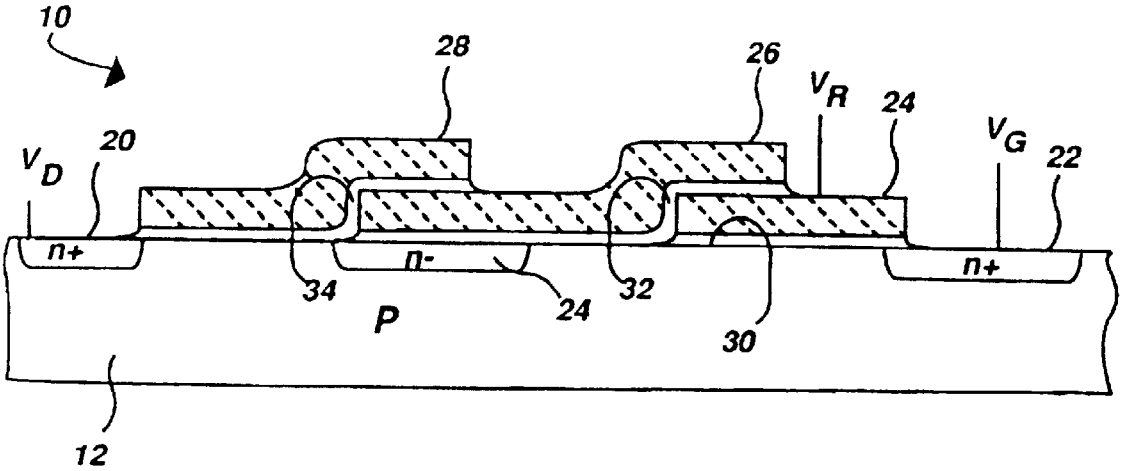
FIG. 1 is a cutaway view of a three layer thick-oxide EEPROM device constructed in accordance with the present invention.

Referring now to FIG. 1, there is shown a cutaway view of a three layer polysilicon device which may advantageously employ the tunneling oxide layer of the present invention. The operation and manufacture of the device of FIG. 1 is substantially described in U.S. Pat. No. 4,599,706, the difference being the substitution of the present deposited oxide for the thermal oxide described in the above U.S. patent.

The EEPROM device 10 of FIG. 1 is formed on a substrate 12 which comprises a "p"-type semiconductor material. Two n+ regions 20, 22 are diffused on opposing ends of the substrate. An n− region 24 is diffused in a central upper region of substrate 12. The n+ source, drain regions 20, 22 and n− diffusion 24 may be formed using a conventional well known diffusion process. The EEPROM device 10 further includes a polysilicon electrode 24 which is isolated from substrate 12 by oxide region 30 and polysilicon electrodes 26 and 28 which are separated from the substrate, and each other by tunneling oxide regions or elements 32 and 34. In prior EEPROM devices, the oxide used for forming these tunneling elements 32, 34 was thermally grown, which is believed to cause stress and defects in tunneling oxide elements 32, 34 because defects from the underlying silicon substitution or polysilicon region may propagate into the tunneling oxide.

The present invention contemplates the use of a low pressure chemical vapor deposition process to form elements 32, 34. In a thermal oxidation process, once the tunneling oxides are grown, subsequent thermal processing causes thermal stress in the oxide, thus causing additional breakdown and charge trap-up problems in the device. The present invention contemplates the use of a low temperature process to minimize thermal oxide growth during the processing of the device, which significantly reduces stress and thereby increases the useful life of the device. This feature has also been found to enhance electron tunneling in the resulting device. Furthermore, the low pressure chemical vapor deposition process used according to the present invention for forming an oxide layer is believed to avoid the propagation of defects into the oxide from the underlying substrate or polysilicon.

Atmospheric deposition of silicon has been attempted in the past using silicon rich $SiO_2$ in a chemical vapor deposition process. One such process is described in an article entitled "Silicon—Rich $SiO_2$ and Thermal $SiO_2$ Dual Dielectric for Yield Improvement and High Capacitance", IEEE Transactions on Electron Devices, Vol. ED-30, No. 8, P. 894, August 1983. The process described in this publication is experimental and has been found to be inadequate for use in manufacturing tunneling oxides because silicon rich $SiO_2$ is not a stoichiometric compound and thus contains impurities which affect the uniformity of the deposited oxide. The use of an atmospheric deposition also creates large variations in thickness of the resulting layer and, therefore, silicon rich $SiO_2$ has only been used for relatively thick layers. Furthermore, although the added silicon in the above process provides a form of enhancement for electron tunneling through the dielectric formed by this process, it's not as efficient as the formation of a textured surface on the underlying silicon substrate or polysilicon conductive layer. This is because the silicon rich $SiO_2$ apparently forms regions or balls of silicon in the silicon dioxide near the surface thereof but spread out. Thus, they are not conductive with each other or with the surface of the dielectric and so are less efficient as enhanced emission structures as compared with the textured surface of a polysilicon layer.

Other commonly used deposited oxide processes have been developed in the past for forming oxide layers between metal layers in the range of 0.5 microns to several microns or for filling trenches. However, these processes have been found to be inadequate for forming thinner layers (on the order of 2000 or less Angstroms) such as are required for tunneling oxide elements, because these processes have poor uniformity and suffer from low breakdown voltages at such thicknesses. One such process employs tetraethylorthosilicate (TEOS) which is available from the J.C. Schumacher Co. and has typically been used for thick oxide processes. This material is also called tetraethyloxysilane.

The present invention overcomes the above problem by modifying the known deposited oxide process using a densification or annealing step on the TEOS deposited oxide during processing. It has been found that by exposing the TEOS deposited oxide to a steam and inert gas mixture at a relatively high temperature, the properties of the TEOS oxide are modified to equal or exceed those of thermally grown oxides. The resulting material has substantially improved dielectric properties and the resulting material is substantially free of leakage and does not break down in the presence of a strong electric field. It is believed that this annealing process provides more uniform molecular bonding by permitting greater viscous flow in the TEOS deposited oxide thus reducing or eliminating defects in the resulting dielectric layer. Since this steam ambient at the desired annealing temperature grows oxide at a relatively fast rate, which would thereby increase the thickness of the dielectric layer, the inert gas provides a partial pressure which is used to slow this undesired oxide growth rate while allowing the annealing process to proceed. The process of the present invention has been found to increase the total charge conducted through the dielectric layer by at least one order of magnitude before catastrophic breakdown, while at the same time providing a dramatic improvement in processing yields.

Figure 2A:
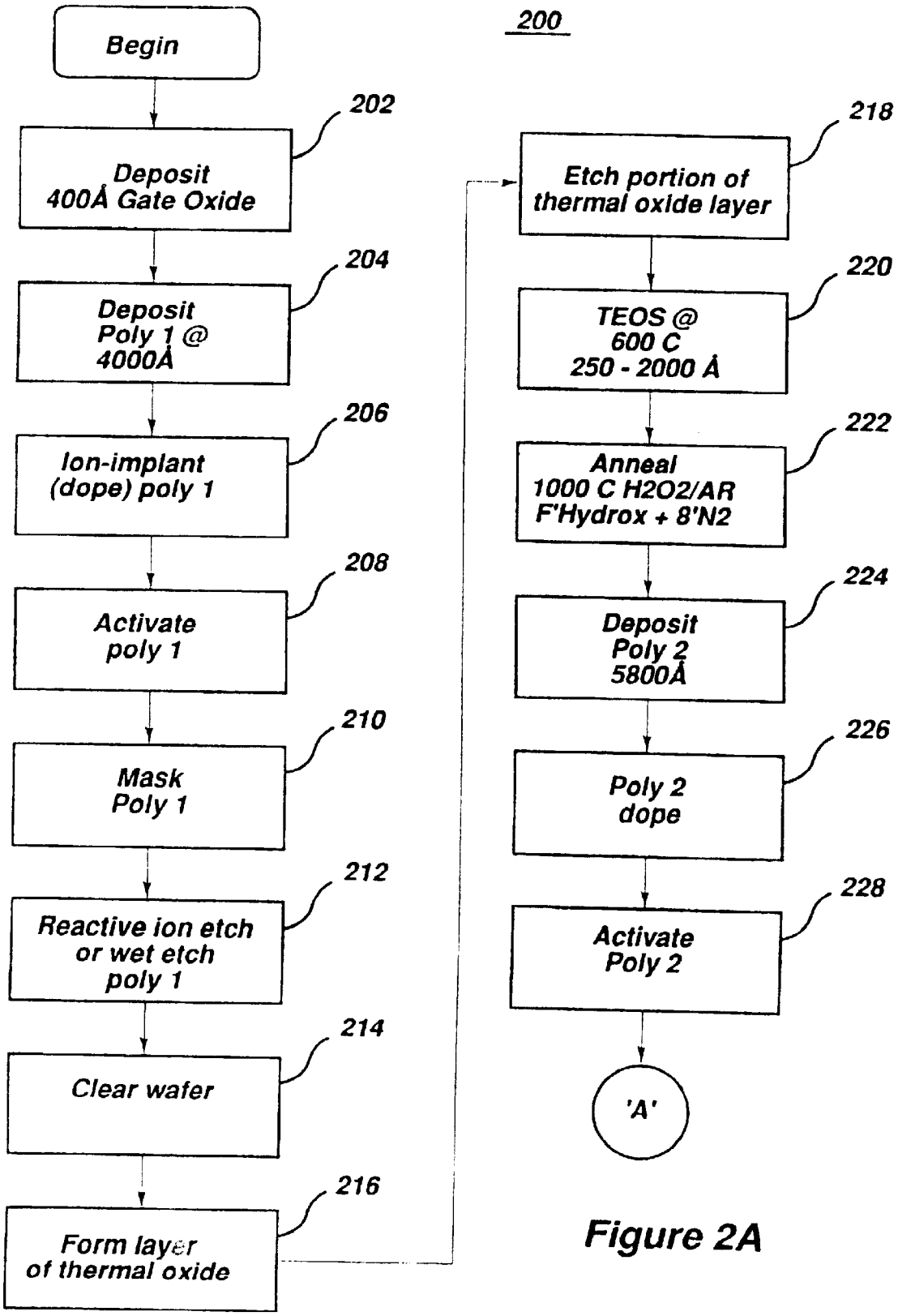
FIG. 2 is a flow diagram detailing a process for manufacturing one of the tunneling oxide regions of the device of FIG. 1.
Figure 2B:
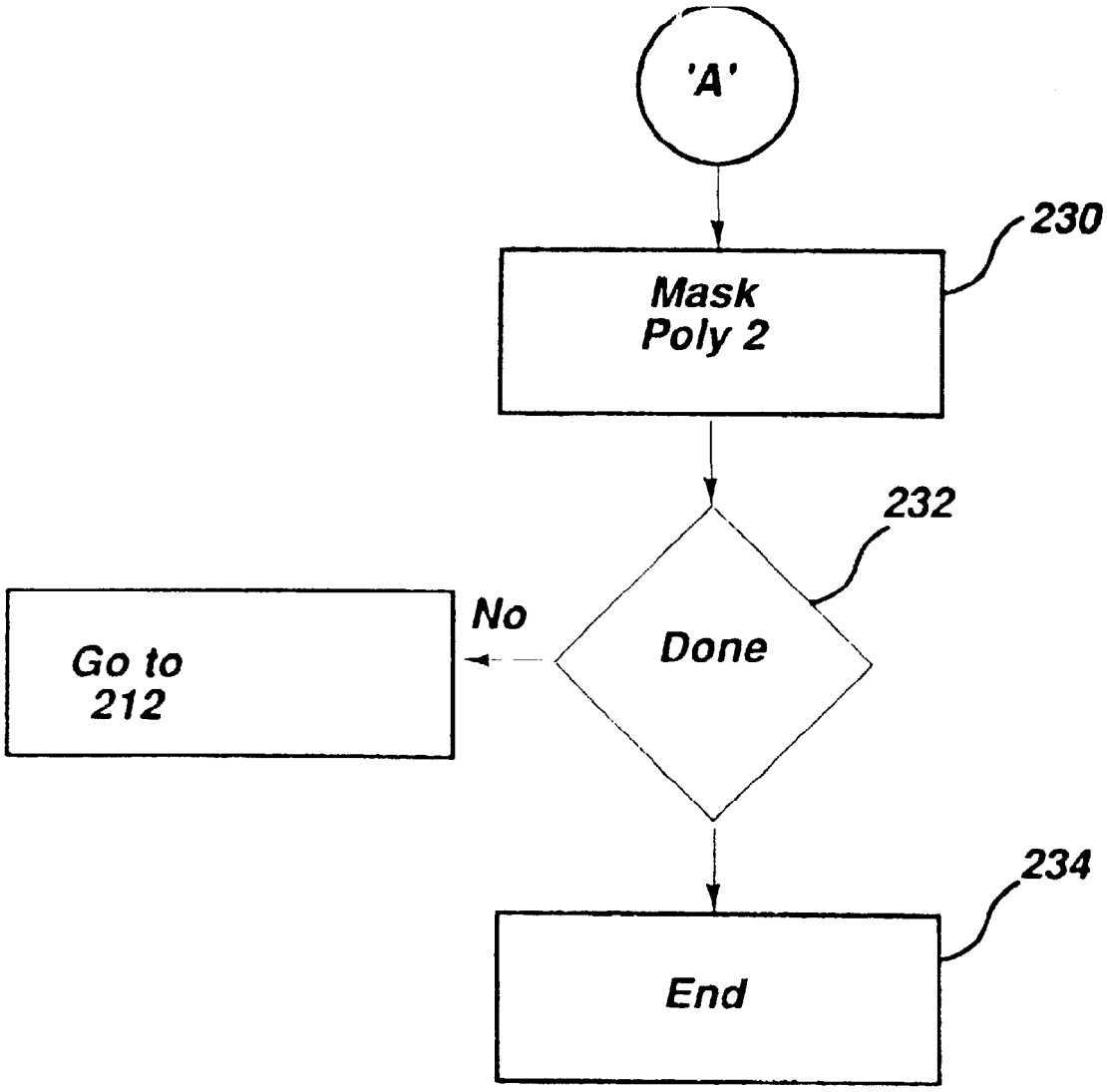

Referring now to FIGS. 2A and 2B, the process 200 begins with step 202 wherein an initial layer of gate oxide, approximately 400 Angstroms thick is deposited on a substrate. This oxide layer may be formed with a conventional thermal oxide process. In step 204 the first layer of polysilicon is formed with a conventional polysilicon deposition process. The first layer of polysilicon is deposited approximately 4000 Angstrons thick. In step 206, the first layer of polysilicon is doped to render the polysilicon layer conductive. The first layer of polysilicon may then be masked in step 210 and etched in step 212 using either a reactive ion etch or wet etch process. In the preferred practice of the present invention, it is desirable that the surface of each tunneling region be somewhat irregular to promote electron tunneling. These surface irregularities or microtextured surfaces are formed by thermally oxidizing the surface of the polysilicon layer with step 216. The thermal oxide of step 216 is then etched back to leave a layer of oxide approximately 150 Angstroms thick. The tunneling oxide layer is then formed by steps 220, 222 and 223. In step 220, oxide is deposited over the relatively thin layer of thermal oxide using a low pressure chemical vapor deposition system with TEOS as the preferred gaseous medium. The TEOS gas is supplied via a bubbler by direct pull with the furnace temperature at approximately 600° C. The deposition rate is controlled primarily by the bubbler and furnace temperatures. The oxide is deposited to create an oxide layer of between 250 and 2000 Angstroms thick. This oxide layer is then annealed in steps 222 and 223.

The annealing process of step 222 is done by exposing the TEOS produced silicon dioxide layer to a gaseous mixture of steam and argon at a temperature range of approximately 700–1100° C. for approximately 1–5 minutes. This is preferrably followed by further thermal annealing in a solely nitrogen ambient at step 223 to prevent further oxidation of the surface. This is performed at the same approximate temperature range for between 2 and 20 minutes. Other annealing processes, such as rapid optical annealing may also be employed at different temperatures and timing as is known in the art for thick deposited oxide layers. The process is continued at step 224 wherein the next layer of polysilicon, approximately 4000–6000 Angstroms thick, is deposited by conventional means. The second layer of polysilicon is then doped in step 226. The second layer of polysilicon is then masked for further processing in step 230. Depending on whether additional layers of polysilicon are required, decision 223 either routes the process back to step 212 or exits the process at step 234. The resulting structure may then be metalized and finished according to conventional means.

In summary, an improved method and means for making a tunneling oxide using TEOS deposited silicon dioxide has been described. Accordingly, other uses and modifications will be apparent to a person of ordinary skill in the art without departing from the scope of the present invention.

What is claimed is:

1. An improved tunneling region for use with an integrated circuit comprising:

a first layer of polysilicon;

a first electron tunneling layer of thermal oxide formed over said first layer of polysilicon;

a second electron tunneling layer of annealed deposited silicon dioxide formed over said first tunneling layer having a thickness less than 2000 Angstroms thick, said silicon dioxide layer being formed by low pressure chemical vapor deposition comprising the use of tetraethylorthosilicate; and a second layer of polysilicon formed over said layer of deposited silicon dioxide, such that when a bias voltage is applied between said first layer of polysilicon and said second layer of polysilicon, electron tunneling will occur from said first layer of polysilicon to said second layer of polysilicon through said first and second electron tunneling layers.

2. The improved tunneling region of claim 1 wherein said first tunneling layer of thermal oxide forms a microtextured surface on top of said first layer of polysilicon for promoting electron tunneling.

3. The improved tunneling region of claim 1 wherein said first tunneling layer of thermal oxide is approximately 150 Angstroms thick.

4. A semiconductor device including means for electron tunneling, comprising:

a first conductive layer;

an annealed silicon dioxide tunneling layer having a thickness less than 2000 Angstroms formed on top of said conductive layer, said silicon dioxide layer being formed by low pressure chemical vapor deposition comprising the use of tetraethylorthosilicate;

a second conductive layer formed on top of said silicon dioxide layer, said first conductive layer acting as a source of tunneling electrons under an appropriate voltage bias condition, said second conductive layer serving as the receptor of said tunneling electrons.

5. The device of claim 4 further comprising a layer of thermal oxide between said first conductive layer and said silicon dioxide tunneling layer for forming a microtextured surface on said first conductive layer for promoting electron tunneling therefrom.

6. The device of claim 5 wherein said thermally grown oxide layer is relatively thin in comparison to said silicon dioxide tunneling layer.

7. The device of claim 5 wherein said thermally grown oxide layer is approximately 150 Angstroms thick.

8. The device of claim 4 wherein said silicon dioxide layer is annealed in steam environment.

9. The device of claim 4 wherein said first conductive layer comprises polysilicon.

10. The device of claim 9 wherein said first conductive layer has a microtextured surface to promote electron tunneling.

11. The device of claim 4 wherein said semiconductor device is part of an EEPROM.

*12. An improved tunneling region for use with an integrated circuit comprising:*

*a first layer of polysilicon;*

*a first electron tunneling layer of thermal oxide formed over said first layer of polysilicon;*

*a second electron tunneling layer of annealed deposited silicon dioxide formed over said first tunneling layer having a thickness less than 2000 Angstroms thick, said silicon dioxide layer being formed by low pressure chemical vapor deposition; and*

*a second layer of polysilicon formed over said layer of deposited silicon dioxide, such that when a bias voltage is applied between said first layer of polysilicon and said second layer of polysilicon, electron tunneling will occur from said first layer of polysilicon to said second layer of polysilicon through said first and second electron tunneling layers.*

*13. A semiconductor device including means for electron tunneling, comprising:*

*a first conductive layer;*

*an annealed silicon dioxide tunneling layer having a thickness less than 2000 Angstroms formed on top of said conductive layer, said silicon dioxide layer being formed by low pressure chemical vapor deposition; and*

*a second conductive layer formed on top of said silicon dioxide layer, said first conductive layer acting as a source of tunneling electrons under an appropriate voltage bias condition, said second conductive layer serving as the receptor of said tunneling electrons.*

* * * * *